US006452197B1

(12) United States Patent
Ito

(10) Patent No.: US 6,452,197 B1
(45) Date of Patent: Sep. 17, 2002

(54) ION IMPLANTATION APPARATUS AND METHOD OF IMPLANTING IONS TO PREVENT CHARGE BUILD UP ON A SUBSTRATE

(75) Inventor: Hiroyuki Ito, Tochigi (JP)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/530,801

(22) PCT Filed: Nov. 6, 1998

(86) PCT No.: PCT/GB98/03320

§ 371 (c)(1),
(2), (4) Date: Aug. 18, 2000

(87) PCT Pub. No.: WO99/25000

PCT Pub. Date: May 20, 1999

(30) Foreign Application Priority Data

Nov. 7, 1997 (GB) .............................................. 9723632

(51) Int. Cl.$^7$ ............................. G21K 5/10; H01J 37/08
(52) U.S. Cl. .................................................. 250/492.21
(58) Field of Search .................................... 250/492.21

(56) References Cited

U.S. PATENT DOCUMENTS

| | | | |
|---|---|---|---|
| 4,914,292 A | 4/1990 | Tamai et al. | |
| 5,343,047 A | 8/1994 | Ono et al. | |
| 5,399,871 A | 3/1995 | Ito et al. | 250/492.21 |
| 5,420,433 A | 5/1995 | Oae et al. | |

FOREIGN PATENT DOCUMENTS

| | | |
|---|---|---|
| EP | 0637834 | 8/1995 |
| EP | 0 785 568 A2 | 7/1997 |
| JP | 03230467 | 10/1991 |
| JP | 7-45232 | 2/1995 |

OTHER PUBLICATIONS

"Faraday Cup Configuration for Ion Beam Measurement", Anonymous, Mar. 1976, IBM Technical Disclosure Bulletin, vol. 18, No. 10, pp. 3227–3228.

"Charge Control for High–Current Ion Implant", Erokhin, Y., et al., Solid State Technology, vol. 40, No. 6, Jun. 1997, pp. 101–102.

"Uptime Improvements by Using a Faraday With Magnetic Electron Suppression", p. Lundquist, et al., Ion Implantation Technology, Jun. 13–17, 1994, pp. 702–705.

Primary Examiner—John P. Lee
Assistant Examiner—Johnnie L Smith, II
(74) Attorney, Agent, or Firm—Boult Wade Tennant

(57) ABSTRACT

In ion implantation processes, secondary electrons are emitted from a substrate in an ion implanter during ion implantation and have the effect of producing excessive negative charge build up on the substrate damaging the substrate. An apparatus and a method is provided in which the negative charge build up on the substrate is restricted by extending a magnetic filter across the ion beam between a substrate holder and a plasma flood source of the ion implanter to deflect the secondary electrons with higher energies above about 15 eV out of the ion beam to be absorbed by a conductive element, preventing re-attachment of the high energy secondary electrons to the substrate and allowing lower energy electrons below about 15 eV, which are necessary for neutralising positive charge build up on the substrate caused by the ion beam, to diffuse across the magnetic filter without being deflected out of the ion beam.

13 Claims, 2 Drawing Sheets

ION IMPLANTATION APPARATUS AND METHOD OF IMPLANTING IONS TO PREVENT CHARGE BUILD UP ON A SUBSTRATE

This application is the national phase under 35 U.S. C. § 371 of PCT International Application No. PCT/GB98/03320 which has an International filing date of Nov. 6, 1998, which designated the United States of America.

FIELD OF THE INVENTION

The present invention relates to a method of preventing negative charge build up on a substrate being implanted with positive ions and in particular to ion implantation apparatus including features for performing such a method.

DESCRIPTION OF THE RELATED ART

In the manufacture of semiconductor devices, a popular processing technology is ion beam implantation whereby a beam of desired impurity ions is directed at the semiconductor substrate so that the ions become implanted in the substrate to create regions of a desired conductivity type, for example. Some regions of the substrate being implanted will be electrically insulated from the main body of the semiconductor substrate. As a result, during implantation with ions, such regions become progressively charged. Usually the implanted ions are positive so that positive charge build up on the substrate surface occurs. If this charge build up exceeds the breakdown voltage of insulated layers and regions in the substrate, damage is caused.

There is thus a known requirement to neutralise charge build up on the surface of substrates during ion implantation, and in particular to neutralise positive charge build up.

Known techniques for neutralising this positive charge build up involve flooding the region of the ion beam immediately in front of the substrate with low energy electrons. Any positive charge build up on the substrate tends to attract these electrons to the substrate surface to discharge the surface. Examples of electron flood apparatus, also known as plasma flood guns, are disclosed in U.S. Pat. No. 5,089,710 and U.S. Pat. No. 5,399,871.

In order to be effective the electron flood systems used for substrate neutralisation must produce relatively low energy electrons, which can then readily be attracted to the substrate by relatively small positive charges arising on the substrate. Further, excessively energetic electrons in front of the substrate can impinge upon and stick to the substrate surface even though any positive charge on the substrate surface has already been fully discharged, and thereby build up an excess negative electrostatic charge on the surface. The degree to which a negative electrostatic charge can accumulate on the substrate surface is related to the energy of the electrons in the region in front of the substrate.

Known electron flood systems are designed to ensure that the electrons flooded into the beam in front of the substrate have desirably low energies, typically less than or equal to 5 eV. However, even when the flood electrons have very low energies, excessive negative charge build up on substrate surfaces has been observed during implantation with positive ion beams.

It is known that, during implantation with positive ions, secondary electrons are emitted from the substrate. Reference may be made to the article entitled "Uptime Improvements by Using a Faraday with Magnetic Electron Suppression" by Lundquist et al, published in Ion Implantation Technology—94, pages 702 to 705, by Elsevier Science B.V. This article discusses the need to ensure such secondary electrons emitted from the substrate are captured by a Faraday body located in front of the substrate, where such a Faraday body is used for beam current measurement. For this purpose, the article proposes a magnetic electron suppression device to be located upstream (relative to the beam direction) of the Faraday body. This suppression device is intended to prevent both electrons travelling with the ion beam from entering the Faraday body, and secondary electrons emitted from the substrate from leaving the Faraday body. According to the article, the magnetic field gradient produced by the suppression device at the upstream end of the Faraday body behaves in the same fashion as a magnetic bottle to reflect the electrons back in the direction from which they came. The purpose of the magnetic suppression device is to reflect back all electrons which would otherwise escape from the Faraday body. FIG. 1 in the article shows that a PFG/EFG (Plasma Flood Gun/Electron Flood Gun) is located, between the substrate and the magnetic electron suppression device, to flood electrons into the Faraday body for the purpose of ensuring neutralisation of positive charge build up on the substrate.

The described system also has an array of alternating magnetic poles around the edge of the Faraday body immediately adjacent the substrate or wafer. These provide "short range magnetic suppression" intended "to keep electrons from escaping in the gap between the spinning disc (carrying the wafer) and the Faraday. The fields from these magnets within the Faraday are also low" (page 704, bottom of the left hand column). Clearly, the short range magnetic suppression between the Faraday body and the wafer itself does not function to prevent electrons from the flood gun diffusing to prevent positive charge build up on the wafer, or to prevent secondary electrons emitted from the wafer from entering the Faraday body.

With the arrangement disclosed in the above article, it is clear that secondary electrons emitted from the substrate enter the Faraday body, so that a population of such electrons may exist in this region. The present invention is based on the understanding that the energy distribution of secondary electrons emitted from a substrate during positive ion implantation may have a peak at around 15 eV with an energy tail extending to over 50 eV. Such secondary electrons experiencing multiple collisions in the beam plasma in front of the substrate may be redirected towards the substrate and extend that kinetic energy in impacting the substrate. This can have the effect of producing negative charge build up on regions of the substrate which are insulated (at least for current to discharge a negative electrostatic charge) from the bulk of the substrate material. The resulting negative charge build up can reach the value equivalent to the highest energy of electrons in the region in front of the substrate (say 50 volts) which would be easily sufficient to cause damage to regions of the substrate.

SUMMARY OF THE INVENTION

The present invention provides ion implantation apparatus having an evacuated housing and, contained in said housing,
 a) a holder for holding a substrate for implantation;
 b) a source of positive ions for implanting in said substrate;
 c) a beam of said ions being formed which is directed at said substrate;
 d) an electron flood source to supply low energy electrons to the beam in front of said substrate for neutralising positive charge build up on said substrate;

e) a magnetic filter between said substrate holder and said electron flood source providing a magnetic field extending across the beam in front of said substrate holder, said field having a strength selected to deflect out of the region containing the beam secondary electrons emitted from the substrate with energies above 15 eV, but to allow lower energy electrons including those supplied by said flood source to diffuse across said field without being deflected out of said beam region; and f) a conductive element located out of said beam region to be impacted by and absorb said deflected secondary electrons.

The invention thus provides apparatus which absorbs relatively higher energy secondary electrons emitted from the substrate without impeding the diffusion of the necessary low energy electrons from the flood system to the substrate for neutralisation of positive charge build up. By reducing the number of higher energy secondary electrons in the region immediately in front of the substrate, excessive negative charge build up on the substrate is prevented.

Conveniently said magnetic filter provides said magnetic field with a field strength selected to deflect secondary electrons with energies of above 10 eV and more preferably 5 eV to impact said conductive element. The magnetic filter may include a pair of opposite magnetic poles located on opposite sides of said beam region.

Conveniently, said conductive element comprises a conductive tube surrounding said beam in front of said substrate holder. Thus, the conductive tube may comprise a Faraday body used for measuring the beam current for dosimetry purposes. Where beam current measurements are made in other ways, the conductive tube may still be provided for the purpose of confining the low energy charge neutralisation electrons in the beam region in front of the substrate.

The electron flood source is preferably located to supply said low energy electrons into said conductive tube.

The magnetic filter may be located adjacent to said substrate holder. In the region of said magnetic field, the population density of the higher energy electrons can be much reduced, with a concomitant reduction in the density of these electrons immediately in front of the substrate. The closer the magnetic field is to the substrate, the more effectively the population density of the higher energy electrons immediately in front of the substrate is reduced.

The invention also provides a method of implanting ions in a substrate comprising, holding the substrate in an evacuated housing;

directing a beam of desired positive ions at the substrate for implanting therein;

flooding the beam in front of the substrate with low energy electrons from an electron flood source to neutralise positive charge build up on the substrate;

applying a magnetic filtering field extending across the beam between the substrate and the electron flood source, said field having a strength selected to deflect out of the region containing the ion beam secondary electrons emitted from the substrate with energies above 15 eV but to allow lower energy electrons, including those from the flood source, to diffuse across said magnetic filtering field without being deflected out of said beam region, and absorbing said second electrons deflected by said magnetic filtering field on a conductive element located out of said beam region. The magnetic filtering field may be a dipole field, but higher order fields such as quadrupole fields may also be used, provided sufficient field strength is obtained completely across the region containing the beam in front of the substrate so that all secondary electrons emitted from the substrate will experience the magnetic field sufficiently to be deflected out of the beam region.

The invention also provides a method of preventing negative charge build up on a substrate being implanted with positive ions comprising absorbing higher energy secondary electrons emitted from the substrate at a location proximate said substrate, said higher energy secondary electrons being those emitted with energies above a predetermined value, whereby the population density of said higher energy secondary electron immediately in front of said substrate is reduced.

Examples of the present invention will now be described with reference to the accompanying drawings in which:

DETAILED DESCRIPTION OF THE INVENTION

Figure 1:
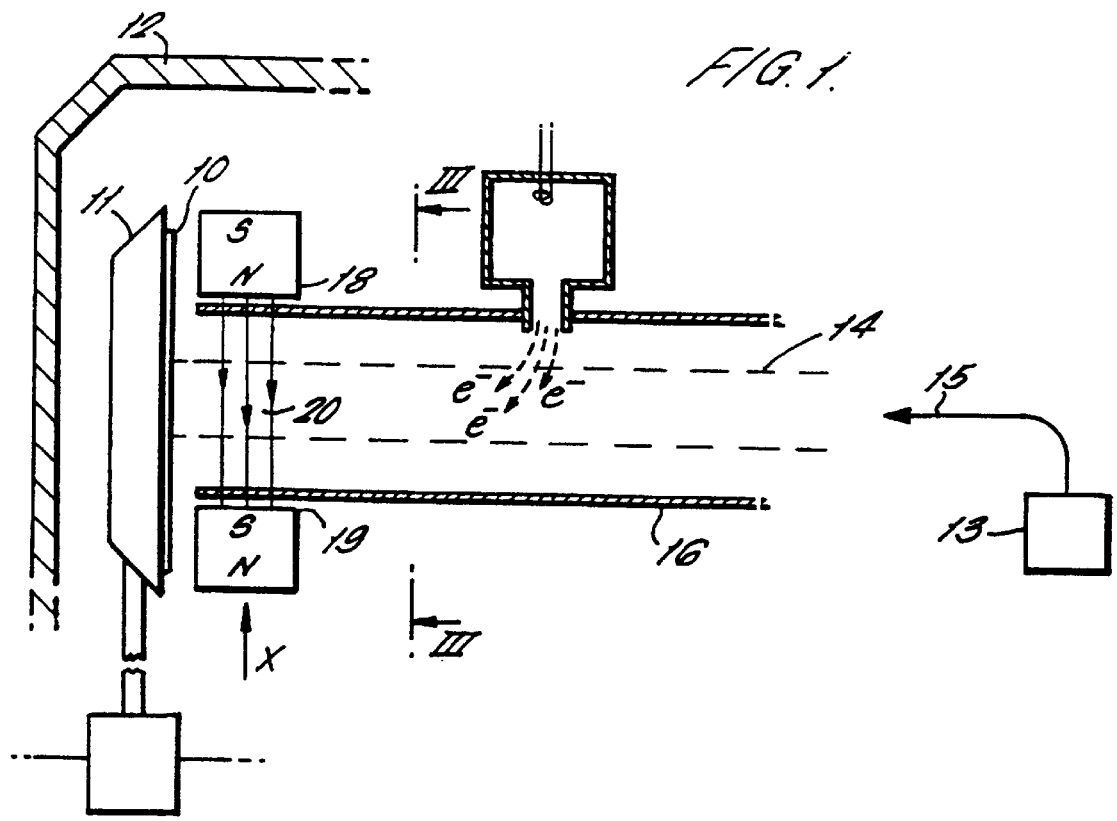
FIG. 1 is a schematic view, partly in cross-section, of the process chamber of ion implantation apparatus, illustrating an ion beam impacting a substrate to be treated, and embodying the present invention.

Referring to FIG. 1, a semiconductor wafer 10, which constitutes a substrate for ion implantation, is shown mounted on a holder 11 in the process chamber of an ion implantation apparatus. A section 12 of the wall of the evacuated housing of the process chamber is shown for illustrative purposes only. In accordance with normal practice which will be understood by those familiar with the technology, the implantation apparatus comprises a source 13 of ions to be implanted. The source 13 is shown out of scale and schematically only in FIG. 1. Ions from the source 13, pass through a mass selection arrangement to select only those ions which it is desired to implant in the wafer 10, and are then directed into the process chamber as a beam 14, travelling in the direction of the arrow 15. Further details of a typical form of ion implantation apparatus can be seen in GB-A-2307096.

Referring again to FIG. 1, as the beam 14 of positive ions approaches the wafer 10, the beam enters a conductive tube 16 having an axis aligned with the beam direction. A Plasma Flood System 17 is arranged to generate a supply of low energy electrons and flood these electrons into the interior of the conductive tube 16. An example of Plasma Flood System is described in the aforementioned U.S. Pat. No. 5,399,871. Any suitable flood system may be used provided the electrons entering the region of the beam in front of the wafer 10 from the flood system have very low energies, typically not greater than 5 eV. The purpose of the electron flood system is to ensure a supply of these low energy electrons in the beam region in front of the substrate, so that any positive charge build up on the substrate or wafer 10 will be discharged by the attraction to the wafer of low energy electrons.

In the described example, the conductive tube 16 serves as an electron confinement tube, with the tube 16 typically at a low negative potential relative to the potential of the wafer 10.

At the end of the conductive tube 16 immediately adjacent the wafer 10 on the holder 11, a magnetic filtering field is produced, by opposed magnetic poles 18 and 19 located on opposite sides of the tube 16. The poles 18 and 19 produce a magnetic field, represented by the field lines 20 in FIG. 1, extending transversely right across the beam region in front of the wafer 10.

Figure 2:
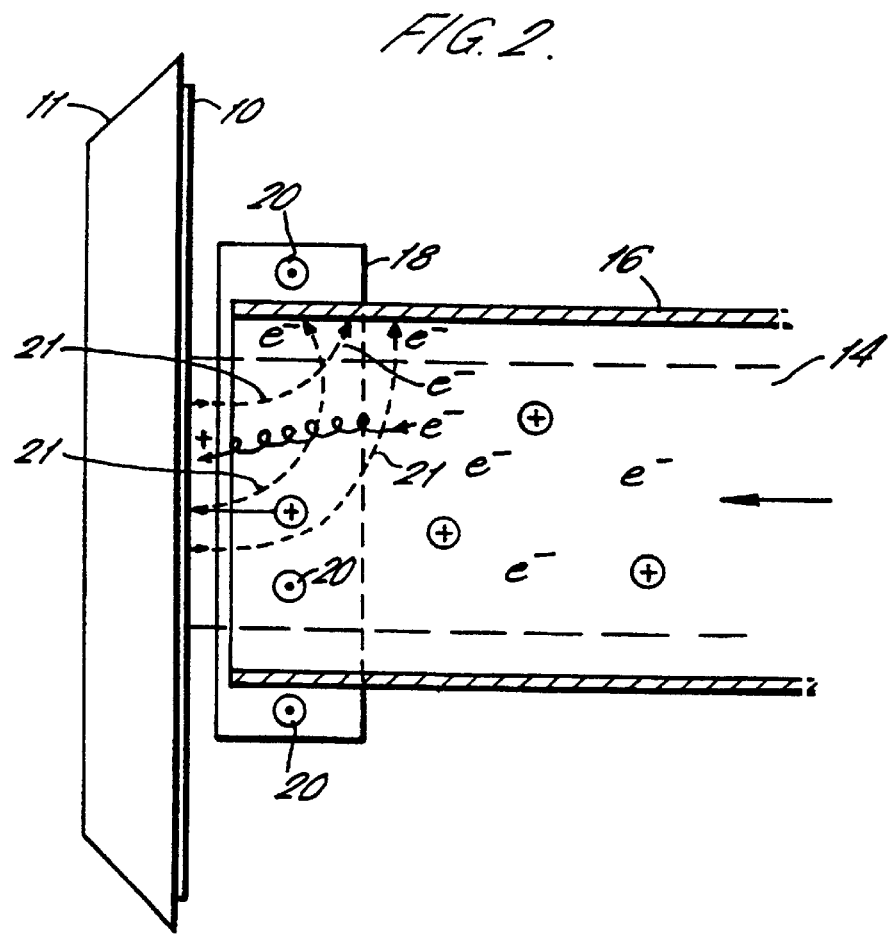
FIG. 2 is an enlarged and detailed view of the magnetic filtering arrangement viewed in the direction of arrow X in FIG. 1.

Referring now to FIG. 2, the effect of the magnetic field produced by the poles 18 and 19 can be explained in more detail. FIG. 2 is a partial cross-section through the confinement tube 16 viewed in the direction of arrow X in FIG. 1 so that only the North pole 18 can be seen in FIG. 2 located behind the end of the tube 16. The magnetic field 20 is illustrated coming directly out of the paper using the conventional symbols.

Importantly, the conductive tube 16 is made from non-ferromagnetic material so that the distribution of the magnetic field is dependent on the shape and positions of the pole pieces 18 and 19.

The magnetic field 20 from the magnetic poles 18 and 19 has sufficient strength to deflect relatively higher energy secondary electrons, such as illustrated by the dotted lines 21, out of the region containing the ion beam 14, so as to impact and be absorbed on the inner surface of the conductive tube 16. The giro radius (Larmour radius) of movement of an electron in a magnetic field is proportional to the energy of the electron. In the present arrangement, a magnetic field is selected to provide a relatively large giro radius for secondary electrons having relatively higher energies, so that these secondary electrons will tend to strike the inner surface of the conductive tube 16. However, lower energy electrons, including those provided by the flood system 17 have lower giro radiuses so that they can diffuse through the magnetic field region without striking the conductive tube 16. In this way, the magnetic field provides a filtering effect, preventing high energy electrons from passing across the field, without hindering the passage of low energy electrons.

Preferably, the magnetic field is set to prevent the passage of secondary electrons from the wafer 10 having energies about 10 eV, and even more preferably to prevent the passage of electrons having energies greater than about 5 eV. Then, only those plasma flood electrons having energies below 5 eV are able to pass through the filter towards the substrate to take part in neutralising any positive charge build up on the substrate.

In the absence of the magnetic field 20, the population density of higher energy secondary electrons in the region within the tube 16 falls in an exponential fashion with distance from a maximum immediately in front of the substrate. The presence of the magnetic field 20 has the effect of greatly reducing the population density of these electrons in the region of or just in front of the field 20. This reduction in density a short distance in front of the substrate results in a reduction also in the population density immediately at the substrate surface. To maximise the reduction where required, at the substrate surface, the magnetic field should be as close as possible to the substrate.

Figure 3:
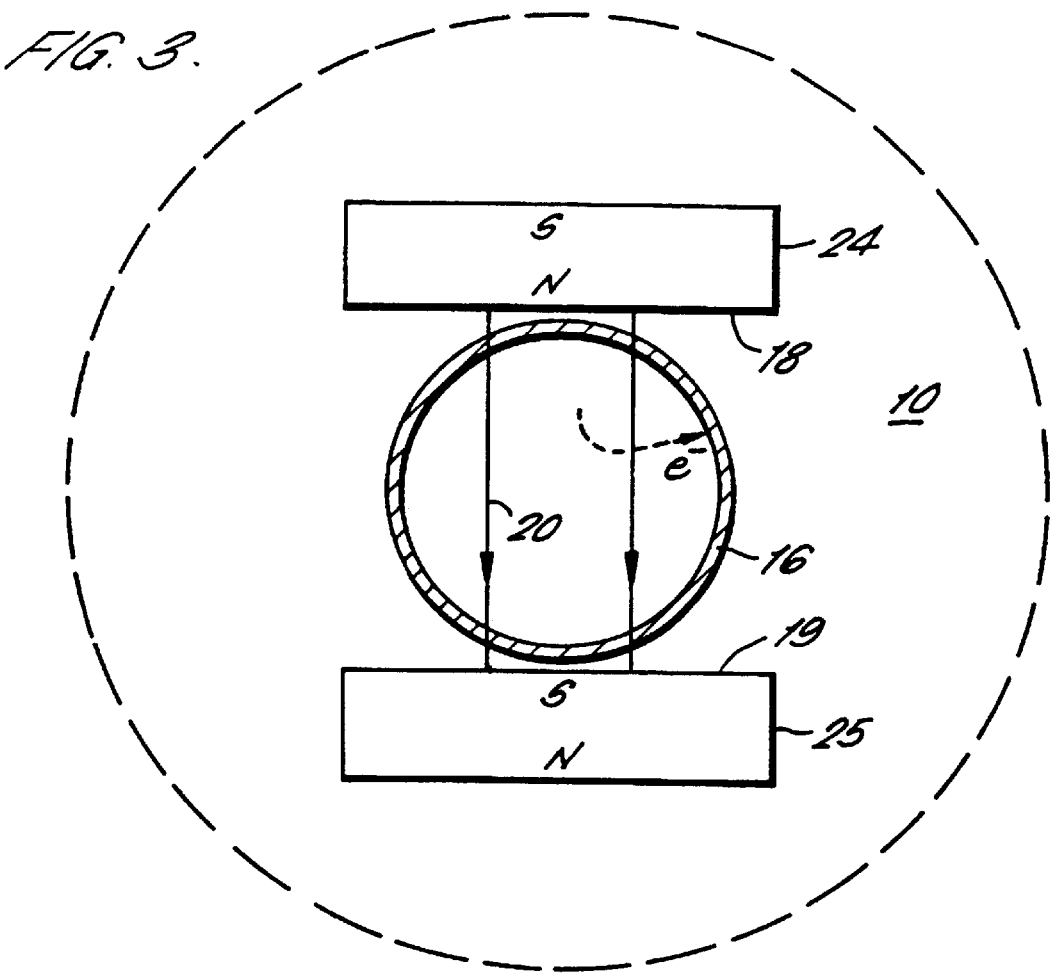
FIG. 3 is a schematic view, partially in cross-section taken along the line III—III in FIG. 1.

FIG. 3 is a view in cross-section along the line III—III of FIG. 1, and illustrates a pair of permanent magnets 24 and 25, providing the magnetic field 20 across the end of the conductive tube 16 in front of the wafer 10. The permanent magnet 24 has a North pole 18 on a long face of the magnet directed towards the conductive tube 16, and a South pole on the opposite long face directed away from the tube 16. Magnet 25 has a corresponding South pole 19 on a long face directed towards the tube on the opposite side of the tube 16 from magnet 24, and has a North pole on the opposite long face of the magnet 25 directed away from the tube 16. There is thus produced a dipole magnetic field 20 extending transversely across the end of the tube 16 completely over the region in front of the wafer 10 containing the ion beam.

Figure 4:
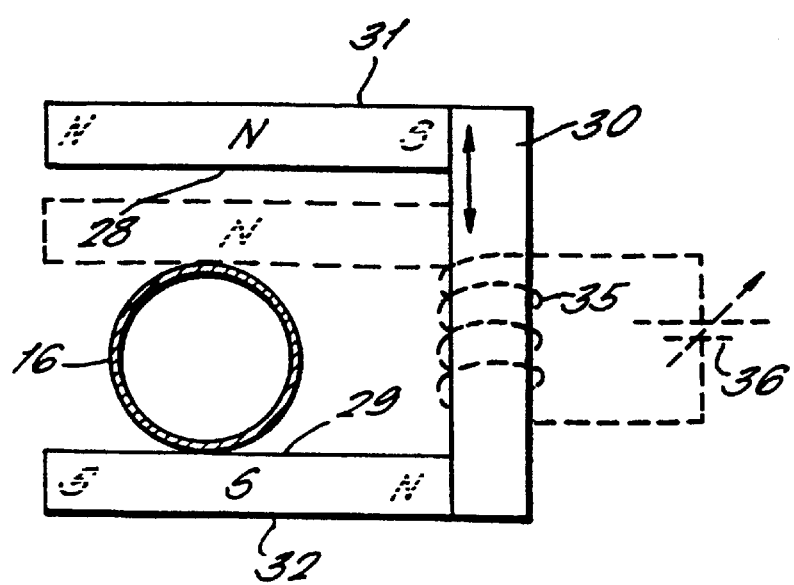
FIG. 4 is a schematic illustration of various embodiments of magnetic structure for use in forming the magnetic filtering field illustrated in FIGS. 1 to 3.

Instead of a pair of permanent magnets 24 and 25, FIG. 4 illustrates an alternative construction in which a single horseshoe magnet has opposed North and South poles 28 and 29 extending on opposite sides of the conductive tube 16. The pole arms 28 and 29 are interconnected by a yoke section 30. The horseshoe magnet illustrated may be formed of a first bar magnet 31 having a North pole to the left and a South pole to the right as illustrated by the dotted N and S in FIG. 4, and a second bar magnet 32 beneath the tube 16, having a South pole to the left and a North pole to the right. The right hand ends of the two bar magnets 31 and 32 are then interconnected by a soft ion yoke 30 to produce in effect the horseshoe magnet with the upper North pole 28 and lower South pole 29.

With this construction, the strength of the magnetic field between the upper and lower poles 28 and 29 can be adjusted by adjusting the spacing along the yoke 30 of the two bar magnets 31 and 32. A reduced spacing, to the position illustrated in dotted outline in FIG. 4, produces an increased magnetic field. In this way, the magnetic field can be "tuned" to filter out only secondary electrons of energies above a desired value, and to ensure adequate diffusion of lower energy electrons through a magnetic field, as necessary to provide adequate neutralising of positive charge build up on the wafer.

Instead of using permanent magnets, the magnetic filter can be formed by an electromagnet, comprising a soft ion U shaped member of the form shown in FIG. 4, with an energising coil 35 wound around the yoke portion 30 and energised with a DC current from a supply 36. With an electromagnet, the magnitude of the magnetic field produced can be adjusted by varying the energising current through the coil 35 with a variable supply 36.

In the examples described above, dipole magnetic fields are shown. However other magnetic field structures may be employed provided they ensure sufficient field strength completely across the beam region so that secondary electrons emitted from any part of the substrate can be deflected to the conductive tube 16 for absorption.

Although the illustrated construction shows a conductive tube surrounding the beam in front of the wafer 10, it should be understood that any conductive element may be employed to collect high energy secondary electrons deflected by the magnetic field out of the beam region. For example, if most of such secondary electrons are deflected to one side, e.g. upwards with a field as illustrated in FIG. 2, a collecting plate may be provided only at this one location to collect the deflected secondary electrons.

What is claimed is:

1. Ion implantation apparatus having an evacuated housing and, contained in said housing,
   a) a holder for holding a substrate for implantation;
   b) a source of positive ions for implanting in said substrate;
   c) a beam of said ions being formed which is directed at said substrate;
   d) an electron flood source to supply low energy electrons to the beam in front of said substrate for neutralizing positive charge build up on said substrate;
   e) a magnetic filter located adjacent to said substrate holder between said substrate holder and said electron flood source providing a magnetic field extending across the beam immediately in front of said substrate, said field having a strength selected to deflect out of the region containing the beam secondary electrons emitted from the substrate with energies above 15 eV, but to allow lower energy electrons including those supplied by said flood source to diffuse across said field without being deflected out of said beam region; and f) a conductive element located out of said beam region to be impacted by and absorb said deflected secondary electrons;

said magnetic filter being located substantially at a substrate end of the conductive element.

2. Apparatus as claimed in claim 1, wherein said magnetic filter provides said magnetic field with a field strength selected to deflect secondary electrons with energies above 5 eV to impact said conductive element.

3. Apparatus as claimed in claim 1, wherein said magnetic filter includes a pair of opposite magnetic poles located on opposite sides of said beam region.

4. Apparatus as claimed in claim 1, wherein said conductive element comprises a conductive tube surrounding said beam in front of said substrate holder.

5. Apparatus as claimed in claim 4, wherein said electron flood source is located to supply said low energy electrons into said conductive tube.

6. A method of implanting ions in a substrate comprising, holding the substrate in an evacuated housing;

directing a beam of desired positive ions at the substrate for implanting therein;

flooding the beam in front of the substrate with low energy electrons from an electron flood source to neutralize positive charge build up on the substrate;

applying a magnetic filtering field extending across the beam immediately in front of said substrate between the substrate and the electron flood source, said field having a strength selected to deflect out of the region containing the ion beam secondary electrons emitted from the substrate with energies above 15 eV but to allow lower energy electrons, including those from the flood source, to diffuse across said magnetic filtering field without being deflected out of said beam region, and absorbing said secondary electrons deflected by said magnetic filtering field on a conductive element located out of said beam region.

7. A method of implanting as claimed in claim 6, wherein the field strength of the magnetic filtering field is selected to deflect said secondary electrons with energies above 5 eV out of said region for absorbing on said conductive element.

8. A method of implanting as claimed in claim 6, wherein said magnetic filtering field is a dipole field.

9. A method of implanting as claimed in claim 6, wherein the low energy electrons from said flood source are contained around the ion beam region by a conductive tube surrounding the beam in front of the substrate, and said deflected secondary electrons are absorbed on said tube.

10. A method of preventing negative charge build up on a substrate being implanted with positive ions comprising absorbing higher energy secondary electrons emitted from the substrate at a located proximate said substrate, said higher energy secondary electrons being those emitted with energies above a predetermined value, whereby the population density of said higher energy secondary electrons immediately in front of said substrate is reduced.

11. A method as claimed in claim 10, wherein said higher energy secondary electrons are absorbed by deflecting them with a magnetic field extending across the surface of the substrate being implanted to impact and be absorbed on a conductive element.

12. A method as claimed in claim 11, wherein a beam of positive ions is directed at the substrate and said magnetic field extends across said beam to deflect said higher energy secondary electrons to be absorbed on said conductive element located out of the beam region.

13. A method as claimed in claim 11, including the step of flooding the region in front of said magnetic field across the substrate with low energy electrons having energies below said predetermined value, whereby said low energy electrons diffuse through said magnetic field and are absorbed on the substrate to prevent positive charge build up thereon.

* * * * *